(12) United States Patent
Anderson et al.

(10) Patent No.: US 8,957,479 B2
(45) Date of Patent: Feb. 17, 2015

(54) FORMATION OF MULTI-HEIGHT MUGFET

(71) Applicant: International Business Machines Corporation, Armonk, NY (US)

(72) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 13/933,356

(22) Filed: Jul. 2, 2013

(65) Prior Publication Data
US 2013/0285145 A1  Oct. 31, 2013

Related U.S. Application Data

(62) Division of application No. 12/909,919, filed on Oct. 22, 2010, now Pat. No. 8,524,546.

(51) Int. Cl.
*H01L 29/78*  (2006.01)
*H01L 27/088*  (2006.01)
(Continued)

(52) U.S. Cl.
CPC .... *H01L 29/7831* (2013.01); *H01L 21/823431* (2013.01); *H01L 21/823456* (2013.01); *H01L 29/66795* (2013.01); *H01L 29/785* (2013.01); *H01L 27/1203* (2013.01)
USPC ............................. 257/365; 257/350; 438/157

(58) Field of Classification Search
CPC ...................... H01L 21/823456; H01L 21/785; H01L 27/0924; H01L 27/1211; H01L 29/42392; H01L 29/66795; H01L 29/785; H01L 29/7855; H01L 29/2856; H01L 29/78645

USPC .......................................... 257/350, 365, 366
See application file for complete search history.

(56) References Cited

U.S. PATENT DOCUMENTS 6,909,147 B2  6/2005  Aller et al.
7,241,653 B2  7/2007  Hareland et al.
(Continued)

OTHER PUBLICATIONS

Pei, et al., "FinFET Design Considerations Based on 3-D Simulation and Analytical Modeling," IEEE Transactions on Electron Devices, vol. 49, No. 8, Aug. 2002, pp. 1411-1419.
(Continued)

*Primary Examiner* — Shaun Campbell
*Assistant Examiner* — Raj R Gupta
(74) *Attorney, Agent, or Firm* — Gibb & Riley, LLC

(57) ABSTRACT

A method and structure comprise a field effect transistor structure that includes a first rectangular fin structure and a second rectangular fin structure, both positioned on a substrate. The sides of the second rectangular fin structure are parallel to the sides of the first rectangular fin structure. Further, a trench insulator is positioned on the substrate and positioned between a side of the first rectangular fin structure and a side of the second rectangular fin structure. A gate conductor is positioned on the trench insulator, positioned over the sides and the top of the first rectangular fin structure, and positioned over the sides and the top of the second rectangular fin structure. The gate conductor runs perpendicular to the sides of the first rectangular fin structure and the sides of the second rectangular fin structure. Also, a gate insulator is positioned between the gate conductor and the first rectangular fin structure and between the gate conductor and the second rectangular fin structure. The gate conductor is positioned adjacent to a relatively larger portion of the sides of the second rectangular fin structure and is positioned adjacent to a relatively smaller portion of the sides of the first rectangular fin structure.

9 Claims, 8 Drawing Sheets

(51) Int. Cl.
*H01L 21/8234* (2006.01)
*H01L 29/66* (2006.01)
*H01L 27/12* (2006.01)

(56) References Cited

U.S. PATENT DOCUMENTS

| | | | |
|---|---|---|---|
| 7,329,913 | B2 | 2/2008 | Brask et al. |
| 7,358,121 | B2 | 4/2008 | Chau et al. |
| 7,456,476 | B2 | 11/2008 | Hareland et al. |
| 7,479,421 | B2 | 1/2009 | Kavalieros et al. |
| 7,498,208 | B2 | 3/2009 | Anderson et al. |
| 7,510,939 | B2 | 3/2009 | Furukawa et al. |
| 7,512,017 | B2 | 3/2009 | Chang |
| 7,517,806 | B2 | 4/2009 | Bryant et al. |
| 7,544,994 | B2 | 6/2009 | Schepis et al. |
| 2004/0262690 | A1* | 12/2004 | Coronel et al. ............. 257/365 |
| 2007/0161171 | A1 | 7/2007 | Burnett et al. |
| 2008/0149593 | A1 | 6/2008 | Bai et al. |
| 2008/0191271 | A1 | 8/2008 | Yagishita et al. |
| 2009/0159972 | A1 | 6/2009 | Jakschik et al. |
| 2009/0206374 | A1 | 8/2009 | Anderson et al. |
| 2009/0206405 | A1* | 8/2009 | Doyle et al. ............. 257/365 |
| 2009/0256205 | A1* | 10/2009 | Liang et al. ............. 257/350 |

OTHER PUBLICATIONS

Breed, et al., "Dual-Gate (FinFET) and Tri-Gate MOSFETS: Simulation and Design," 2003 International Semiconductor Device Research Symposium, pp. 150-151.

H.S.P. Wong, "Beyond the Conventional Transistor," IBM J. Res. & Dev., vol. 46, No. 2/3 Mar./May 2002, pp. 133-168.

U.S. Appl. No. 12/909,919, Office Action Communication Dated Mar. 1, 2013, pp. 1-6.

U.S. Appl. No. 12/909,919, Notice of Allowance Communication Dated Apr. 30, 2013, pp. 1-13.

* cited by examiner

FORMATION OF MULTI-HEIGHT MUGFET

CROSS-REFERENCE TO RELATED APPLICATIONS

This application is a divisional of U.S. patent application Ser. No. 12/909,919, filed Oct. 22, 2010, issued as U.S. Pat. No. 8,524,546 on Sep. 3, 2013, the complete disclosure of which is incorporated herein by reference.

BACKGROUND

The present invention relates to integrated circuit structures, and more specifically, to a method and structure that has different height field effect transistor structures.

As integrated circuit structures evolve, different shapes and surfaces are utilized to increase density. Within a transistor, the semiconductor (or channel region) is positioned between a conductive "source" region and a similarly conductive "drain" region, and when the semiconductor is in a conductive state, the semiconductor allows electrical current to flow between the source and drain. A "gate" is a conductive element that is electrically separated from the semiconductor by a "gate oxide" (which is an insulator) and (a field current/voltage) within the gate changes the conductivity of the channel region of the transistor.

Generally, transistor structures are formed by depositing or implanting impurities into a substrate to form at least one semiconductor channel region, bordered by shallow trench isolation regions below the top (upper) surface of the substrate. In this description, a "P-type transistor" is a positive-type transistor that uses impurities such as boron, aluminum, indium, gallium, etc., within an intrinsic semiconductor substrate (to create deficiencies of valence electrons) as a semiconductor channel region. Similarly, an "N-type transistor" is a negative-type transistor that uses impurities such as antimony, arsenic, phosphorous, etc., within an intrinsic semiconductor substrate (to create excessive valence electrons) as a semiconductor channel region.

One example of such advances is a transistor structure that has a three dimensional fin shape. The ends of the fin are usually conductive and can comprise, for example, source and drain regions of the transistor. The portion of the fin between the source and drain regions usually comprises a semiconductor and is covered by a gate oxide and gate conductor. This structure is sometimes referred to as a FinFET (fin-type field effect transistor). The gate conductor can form multiple gates on the different planar surfaces of the three-dimensional channel region of the fin and this structure is sometimes referred to as a MUGFET (multiple-gate field effect transistor).

SUMMARY

One exemplary embodiment herein that provides further advantages for such structures is a method of simultaneously forming different transistor structures. The method forms trench isolation regions in a silicon layer of a substrate to define a first silicon region and a second silicon region bounded by such trench isolation regions. The method patterns a first hardmask layer to form a first hardmask island on the first silicon region and a second hardmask island on the second silicon region. The method then patterns a second hardmask layer on the first silicon region and the first hardmask island and on the second silicon region and the second hardmask island. The method removes the second hardmask layer from the second silicon region and the second hardmask island to provide second exposed areas of the second silicon region.

Next, the method patterns first and second mandrels over the first and second silicon regions. The method then forms a third hardmask layer over the substrate. The method removes the first and second mandrels to form openings in the third hardmask layer. Then, the method etches the second exposed areas of the second silicon region to form second trenches to a second depth in the second silicon region. The method removes the second hardmask layer from the first silicon region and the first hardmask island to provide first exposed areas of the first silicon region. The method then simultaneously etches the first exposed areas of the first silicon region to form first trenches to a first depth in the first silicon region and further etches the second trenches to a third depth, where the third depth is greater than the first depth.

Another exemplary method embodiment herein similarly forms trench isolation regions in a silicon layer of a substrate to define a first silicon region and a second silicon region bounded by the trench isolation regions. This method also patterns a first hardmask layer to form a first hardmask island on the first silicon region and a second hardmask island on the second silicon region. The method patterns a second hardmask layer on the first silicon region and the first hardmask island and on the second silicon region and the second hardmask island. The method removes the second hardmask layer from the second silicon region and the second hardmask island to provide second exposed areas of the second silicon region.

Next, the method patterns first and second mandrels over the first and second silicon regions. The method forms a third hardmask layer over the substrate. The method then removes the first and second mandrels to form openings in the third hardmask layer. Also, the method etches the second exposed areas of the second silicon region to form second trenches to a second depth in the second silicon region.

The method removes the second hardmask layer from the first silicon region and the first hardmask island to provide first exposed areas of the first silicon region. The method then simultaneously etches the first exposed areas of the first silicon region to form first trenches to a first depth in the first silicon region and further etches the second trenches to a third depth, where the third depth is greater than the first depth. This process of simultaneously etching the first and second silicon regions exposes a greater sidewall area of the second silicon region relative to the first silicon region. The substrate comprises a silicon-on-insulator substrate having the silicon layer on a buried oxide layer and the process of etching the second trenches to the third depth exposes the buried oxide layer.

This method then removes the third hardmask layer to leave the first silicon region and the second silicon region exposed (or partially exposed) as silicon fins. The method patterns a source and drain protective layer over the silicon fins. The source and drain protective layer protects source and drain regions of the silicon fins and leaves channel regions of the silicon fins exposed. The method forms a gate insulator on the channel regions. The method then patterns at least one gate conductor on the gate insulator. The method removes the source and drain protective layer and implants an impurity into the source and drain regions.

Another exemplary structure embodiment herein is a field effect transistor structure that includes a first rectangular fin structure and a second rectangular fin structure, both positioned on a substrate. The first and second rectangular fin structures each have a bottom contacting the substrate, a top opposite the bottom, and sides between the top and the bottom. The sides of the second rectangular fin structure are parallel to the sides of the first rectangular fin structure. Further, a trench insulator is positioned on the substrate and positioned between a side of the first rectangular fin structure and a side of the second rectangular fin structure. A gate conductor is positioned on the trench insulator, positioned over the sides and the top of the first rectangular fin structure and positioned over the sides and the top of the second rectangular fin structure. The gate conductor runs perpendicular to the sides of the first rectangular fin structure and the sides of the second rectangular fin structure. Also, a gate insulator is positioned between the gate conductor and the first rectangular fin structure and between the gate conductor and the second rectangular fin structure. The gate conductor is positioned adjacent to a relatively larger portion of the sides of the second rectangular fin structure and is positioned adjacent to a relatively smaller portion of the sides of the first rectangular fin structure.

One exemplary structure embodiment herein is a field effect transistor structure that similarly includes first rectangular fin structure positioned on the substrate, the first rectangular fin structure again has a bottom contacting the substrate, a top opposite the bottom, and sides between the top and the bottom. Also included is a second rectangular fin structure positioned on the substrate. Similarly, the second rectangular fin structure has a bottom contacting the substrate, a top opposite the bottom, and sides between the top and the bottom. Again, the sides of the second rectangular fin structure are parallel to the sides of the first rectangular fin structure.

This structure also includes a trench insulator positioned on the substrate and positioned between a side of the first rectangular fin structure and a side of the second rectangular fin structure. A gate conductor is positioned on the trench insulator, positioned over the sides and the top of the first rectangular fin structure, and positioned over the sides and the top of the second rectangular fin structure. The gate conductor runs perpendicular to the sides of the first rectangular fin structure and the sides of the second rectangular fin structure. A gate insulator is positioned between the gate conductor and the first rectangular fin structure and between the gate conductor and the second rectangular fin structure.

The sides of the first rectangular fin structure comprise a lower portion and an upper portion. The upper portion of the sides of the first rectangular fin structure are relatively closer to the center of the first rectangular fin structure and the lower portion of the sides of the first rectangular fin structure are relatively farther from the center of the first rectangular fin structure. The gate conductor is positioned adjacent to the upper portion of the sides of the first rectangular fin structure. The lower portion of the sides of the first rectangular fin structure are positioned adjacent to the trench insulator. Thus, the gate conductor is positioned adjacent to a relatively larger portion of the sides of the second rectangular fin structure and is positioned adjacent to a relatively smaller portion of the sides of the first rectangular fin structure. The first and second rectangular fin structures comprise a central semiconductor portion comprising a channel region, and conductive end portions comprising source and drain regions.

DETAILED DESCRIPTION

As mentioned above, FinFET and MUGFET structures are continually being developed and improved and the embodiments herein provide additional advances that allow multiple-height FinFET, MUGFET, and tri-gate structures to be simultaneously formed on a substrate using damascene processing techniques (in a mandrel gate definition process). More specifically, as detailed below, the embodiments herein form a hardmask on selected ones of the fin channel structures to allow the transistors to be formed with different sidewall heights. These different sidewall heights cause the transistors to behave differently, which allows the performance of the various transistors on the substrate to be adjusted to suit a specific design goal. The hardmask materials utilized herein can be selected to optimize etch characteristics/selectivity/ and electrical isolation properties.

Figure 1:
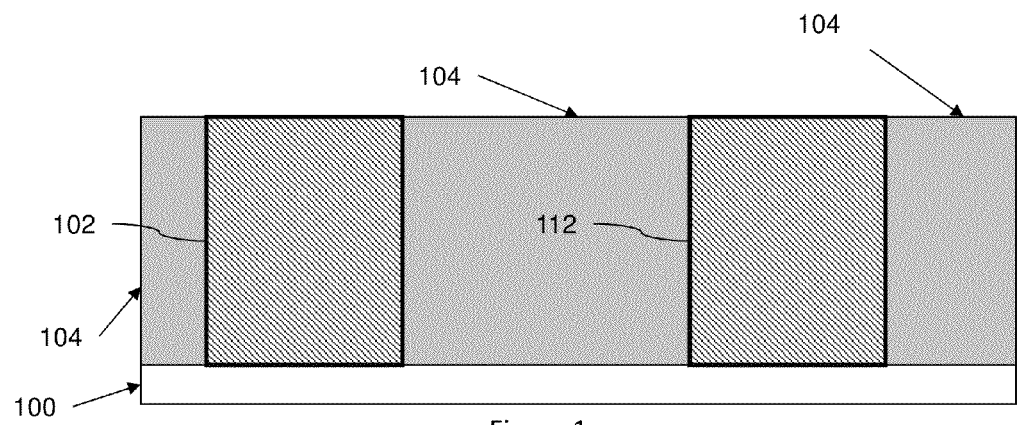
FIG. 1 is a cross-sectional side view of a partially completed transistor structure.
Figure 2:
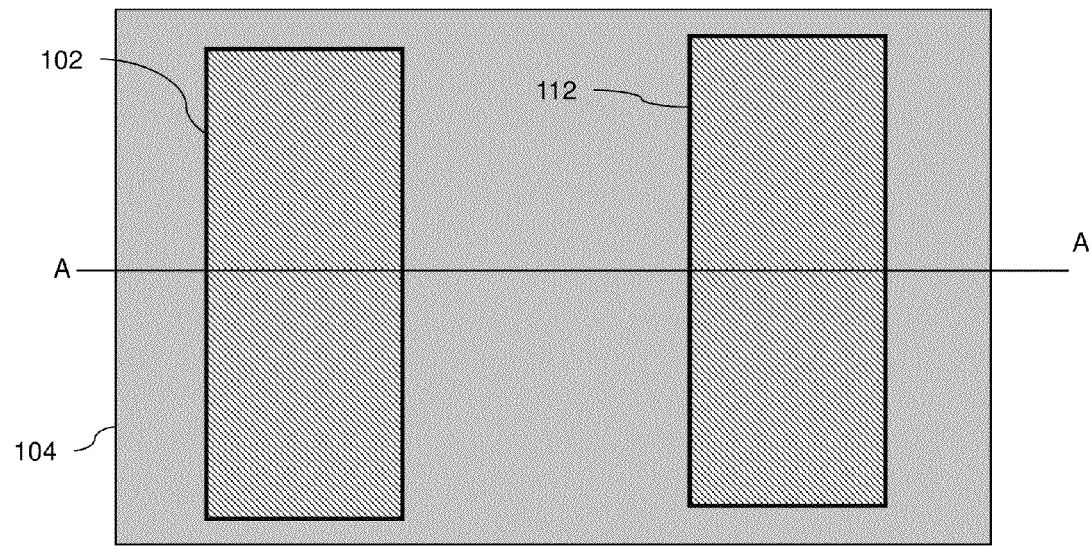
FIG. 2 is a top view of a partially completed transistor structure.

One exemplary method embodiment herein is illustrated in FIGS. 1-14. As shown in side-view in FIG. 1, and in top view in FIG. 2, this embodiment forms trench isolation regions 104 in a silicon layer 102, 112 of a substrate (100, 102, 112) to define a first silicon region 102 and a second silicon region 112 bounded by the trench isolation regions 104. Note that, in the drawings, the side view drawings are a cross-section along line A-A, shown in the top view drawings.

Substrate 100, 102 herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc. The substrates herein can be silicon-on-insulator (SOI) substrates that include (in addition to underlying layers) an insulator layer 100 and a silicon layer 102. The trench isolation regions 104 are well-known to those ordinarily skilled in the art and are generally formed by patterning openings/trenches within the silicon portion 102 of the substrate and growing or filling the openings with a highly insulating material (this allows different active areas of the substrate to be electrically isolated from one another).

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

The silicon portion of the substrate 102 can be doped to comprise a semiconductor. For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

Figure 3:
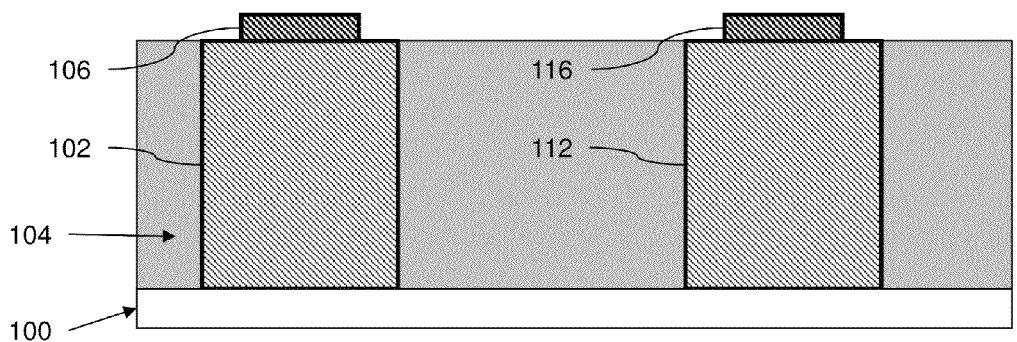
FIG. 3 is a cross-sectional side view of a partially completed transistor structure.

As shown in FIG. 3, this method patterns a first hardmask layer 106, 116 to form a first hardmask island 106 on the first silicon region 102 and a second hardmask island 116 on the second silicon region 112. The hardmask can be formed of any suitable material, whether now known or developed in the future, such as a metal or organic hardmask, etc., that has a hardness measure greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 4:
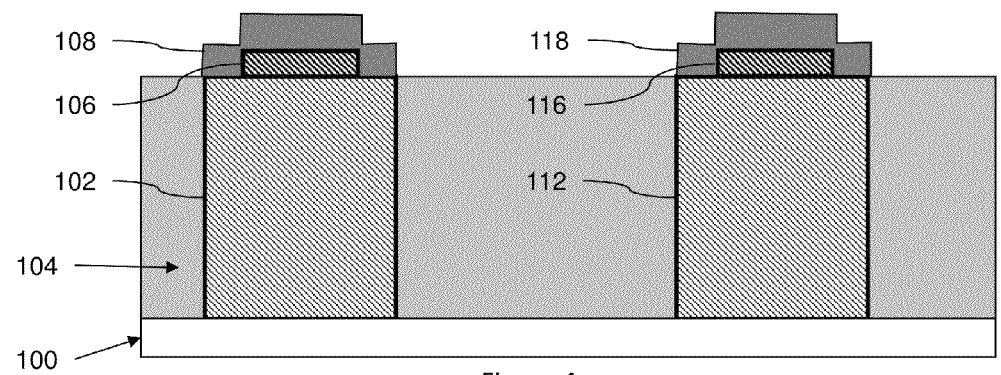
FIG. 4 is a cross-sectional side view of a partially completed transistor structure.
Figure 5:
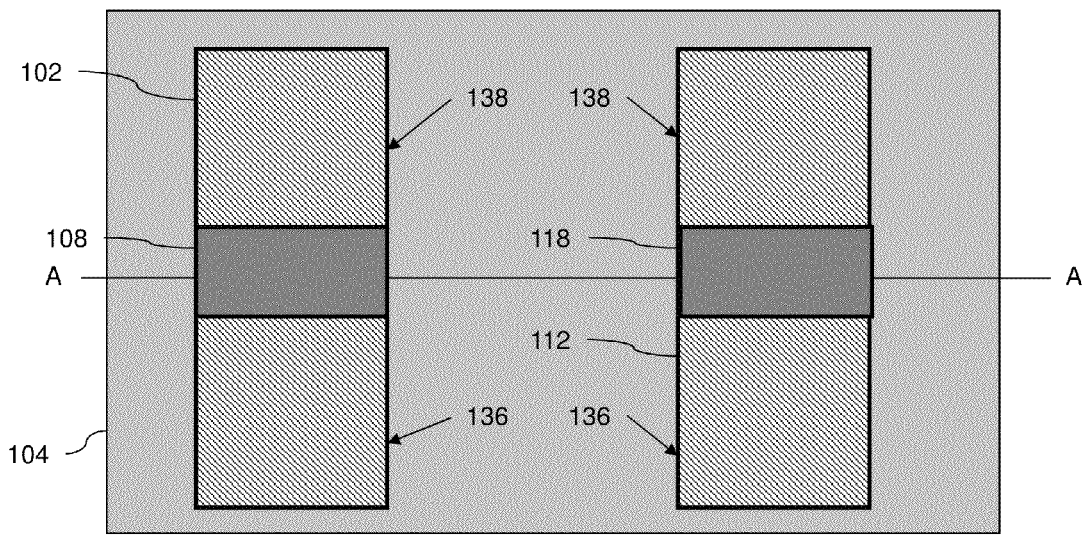
FIG. 5 is a top view of a partially completed transistor structure.
Figure 6:
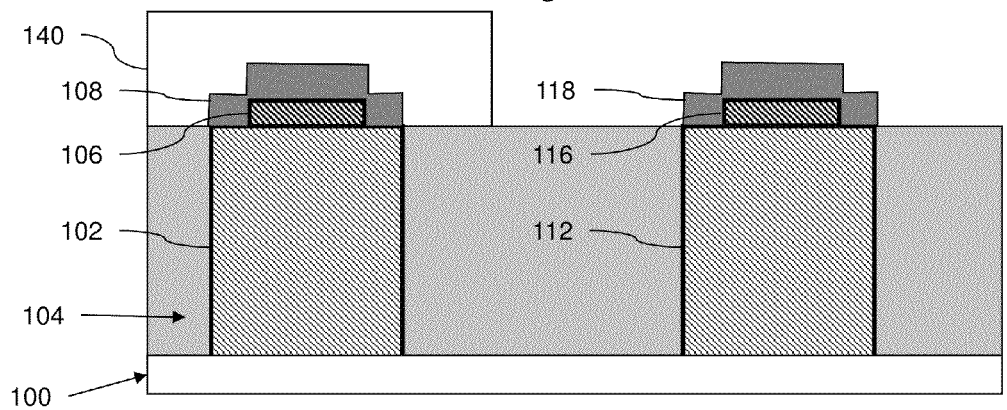
FIG. 6 is a cross-sectional side view of a partially completed transistor structure.
Figure 7:
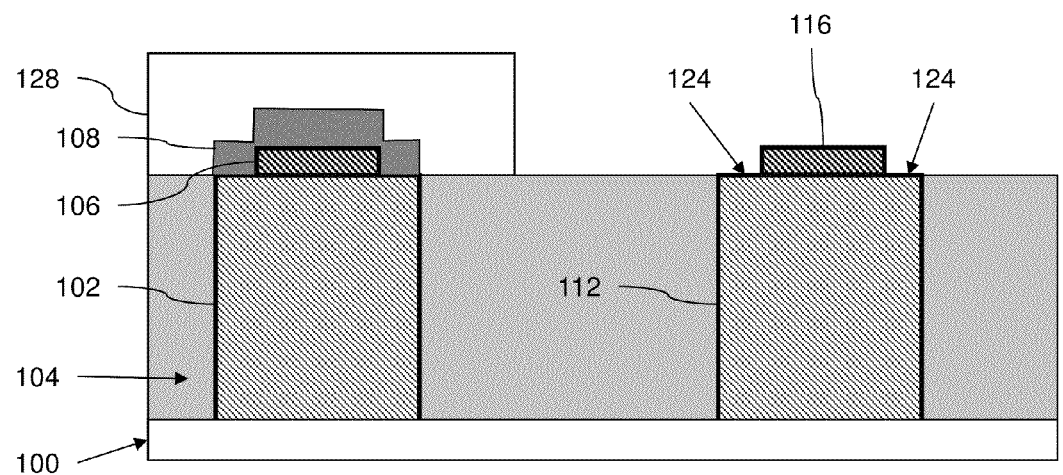
FIG. 7 is a cross-sectional side view of a partially completed transistor structure.

As shown in side view in FIG. 4 and in top view in FIG. 5, the method patterns a second hardmask layer 108, 118 on the first silicon region 102 and the first hardmask island 106 and on the second silicon region 112 and the second hardmask island 116. As shown in FIG. 6, the method forms a protective mask 140 and performs a selective material removal process to remove the unprotected portions second hardmask layer 118 from the second silicon region 112 and the second hardmask island 116. As shown in FIG. 7, this leaves second exposed areas 124 of the second silicon region 112.

Figure 8:
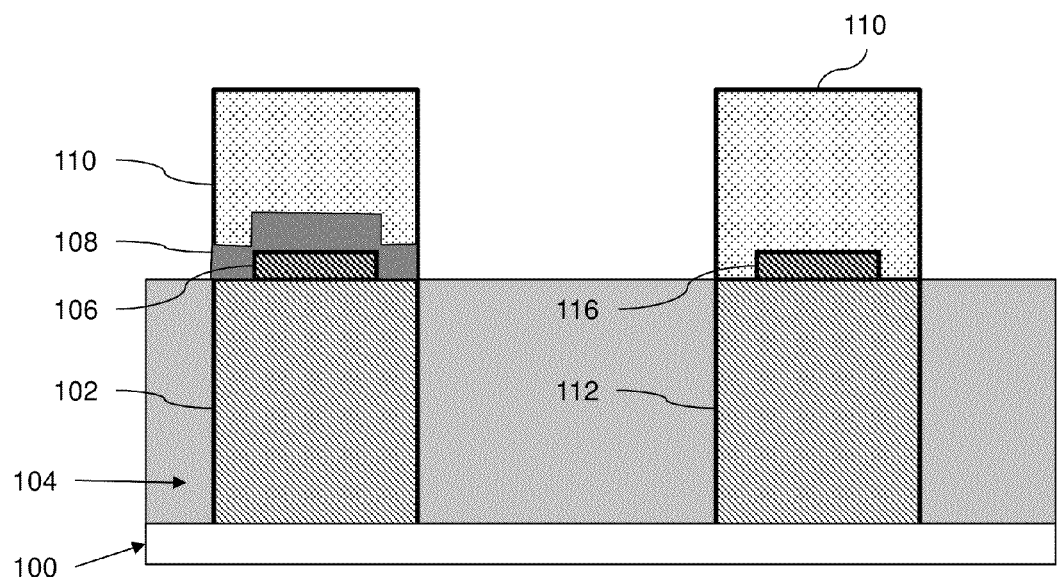
FIG. 8 is a cross-sectional side view of a partially completed transistor structure.
Figure 9:
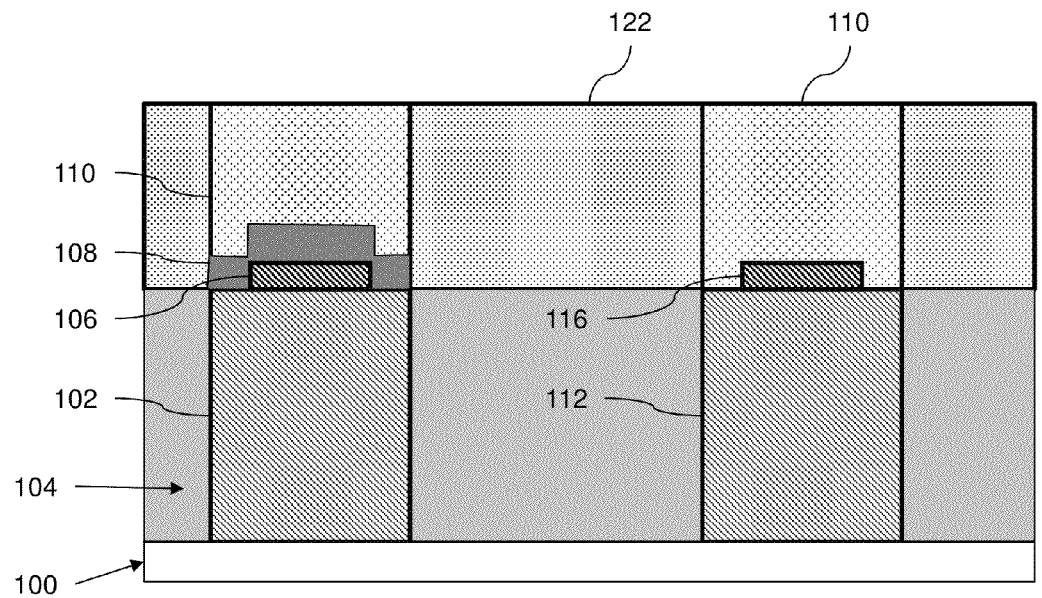
FIG. 9 is a cross-sectional side view of a partially completed transistor structure.
Figure 10:
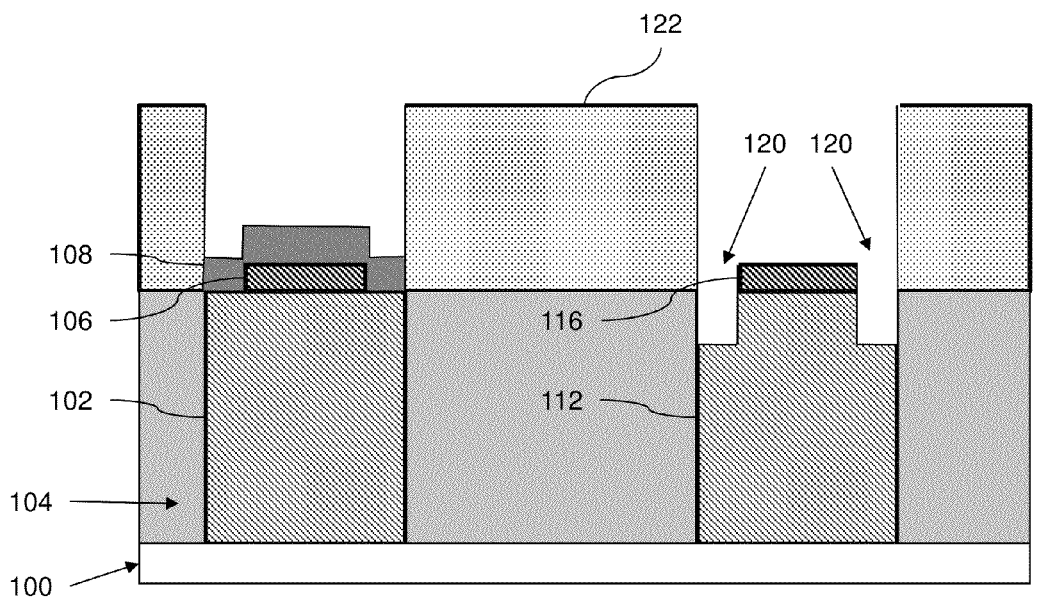
FIG. 10 is a cross-sectional side view of a partially completed transistor structure.

Next, as shown in FIG. 8, the method patterns first and second mandrels 110 over the first and second silicon regions 102, 112 using any of the methods discussed above. As shown in FIG. 9, the method then forms a third hardmask layer 122 over the substrate. In FIG. 10, the method removes the first and second mandrels 110 to form openings in the third hardmask layer 122. Also, the method etches the second exposed areas 124 of the second silicon region 112 to form second trenches 120 to a second depth in the second silicon region 112. Note, that this processing shown in FIG. 10 does not affect the silicon region 102 because it is protected by the second hardmask 108.

Figure 11:
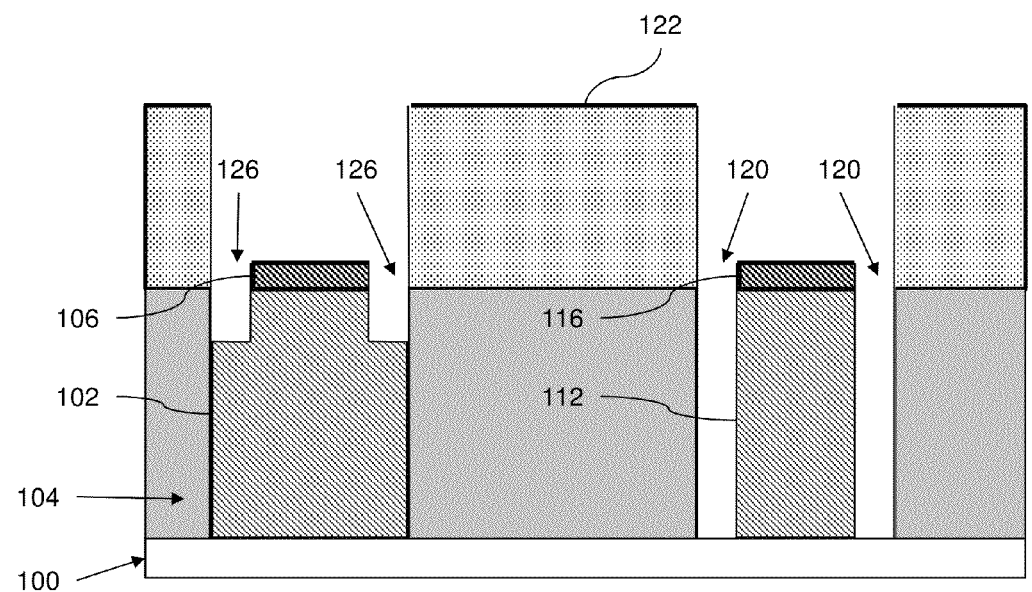
FIG. 11 is a cross-sectional side view of a partially completed transistor structure.
Figure 12:
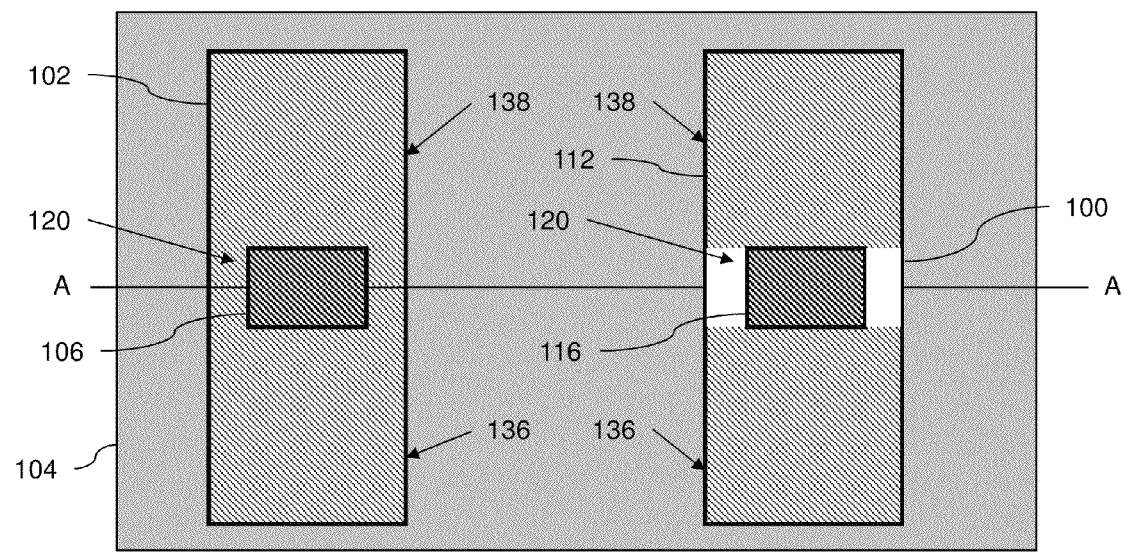
FIG. 12 is a top view of a partially completed transistor structure.

Referring now to side view FIG. 11 and corresponding top view FIG. 12, the method removes the second hardmask layer from the first silicon region 102 and the first hardmask island 106 to provide first exposed areas of the first silicon region 102. The method then simultaneously etches the first exposed areas of the first silicon region 102 to form first trenches to a first depth in the first silicon region 102 and further etches the second trenches 120 to a third depth, where the third depth is greater than the first depth. In this discussion, the "depths" are measured from the junction of the first hardmask 106, 116, and the silicon regions 102, 112. This process of simultaneously etching the first and second silicon regions 102, 112 exposes a greater sidewall area of the second silicon region 112 relative to the first silicon region 102.

Figure 13:
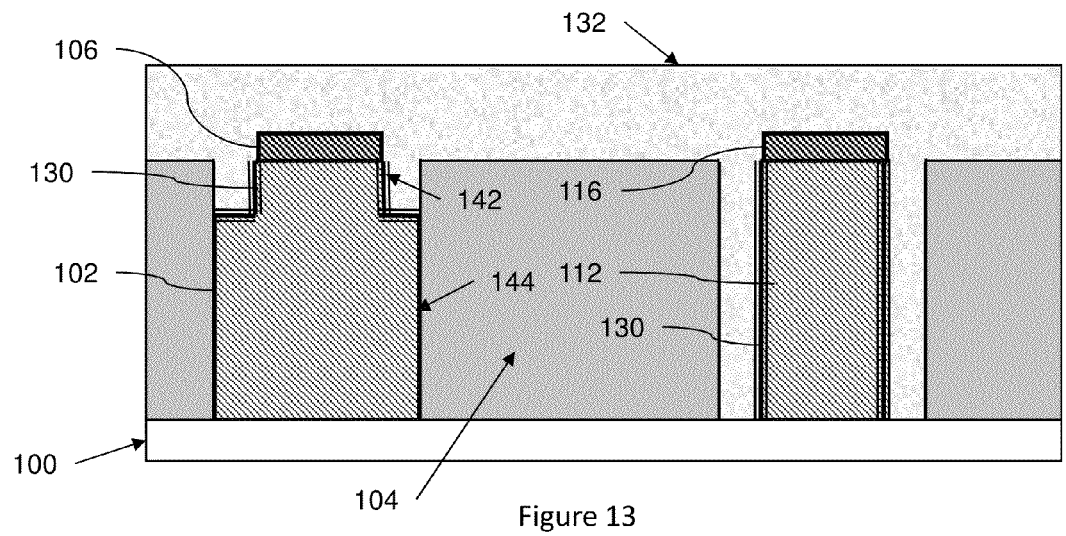
FIG. 13 is a cross-sectional side view of a partially completed transistor structure.
Figure 14:
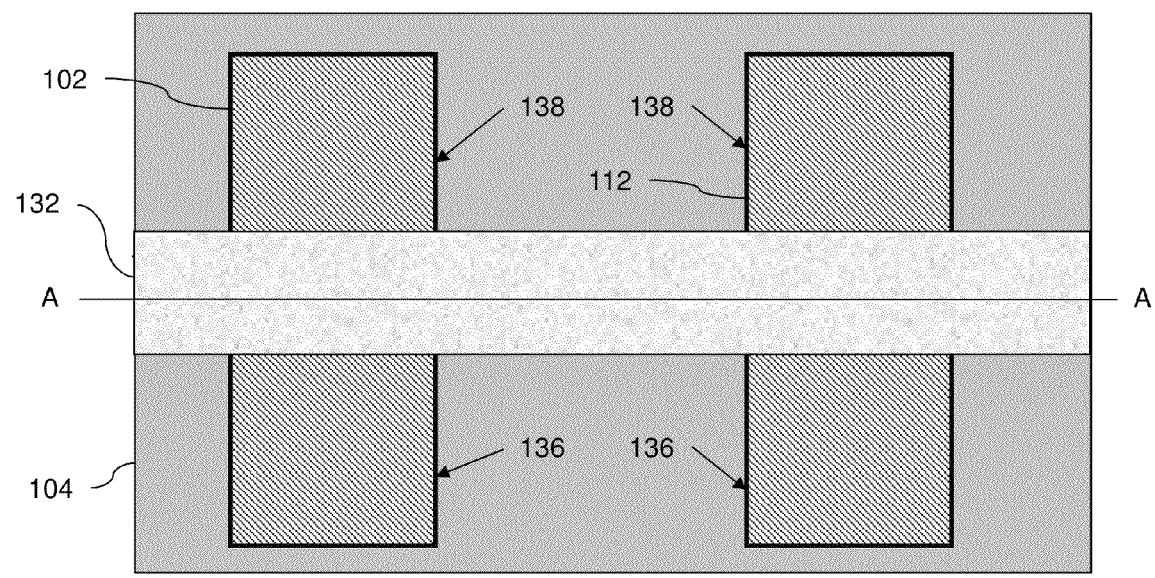
FIG. 14 is a top view of a partially completed transistor structure.

Referring now to side view FIG. 13 and corresponding top view FIG. 14, the method then completes the transistor structures by removing the third hardmask layer 122 to leave the first silicon region 102 and the second silicon region 112 exposed (or partially exposed) as silicon fins. The method patterns a source and drain protective layer over the silicon fins (not shown). The source and drain protective layer protects source and drain regions 136, 138 of the silicon fins and leaves channel regions of the silicon fins exposed. The method forms a gate insulator 130 on the channel regions of the fins. The method then patterns at least one gate conductor 132 on the gate insulator 130. The method removes the source and drain protective layer and implants an impurity into the source and drain regions 136, 138 to make them conductive. An overlying insulator is then formed, and various contacts are formed through the insulator.

As mentioned above, the substrate comprises a silicon-on-insulator substrate having the silicon layer 102, 112 on a buried oxide layer 100 and the process of etching the second trenches 120 to the third depth can exposes the buried oxide layer 100 (as shown in FIGS. 11-14). Alternatively, as shown in FIG. 15, the third depth does not reach fully to the buried oxide layer 100, but does extend deeper than the first depth.

Figure 15:
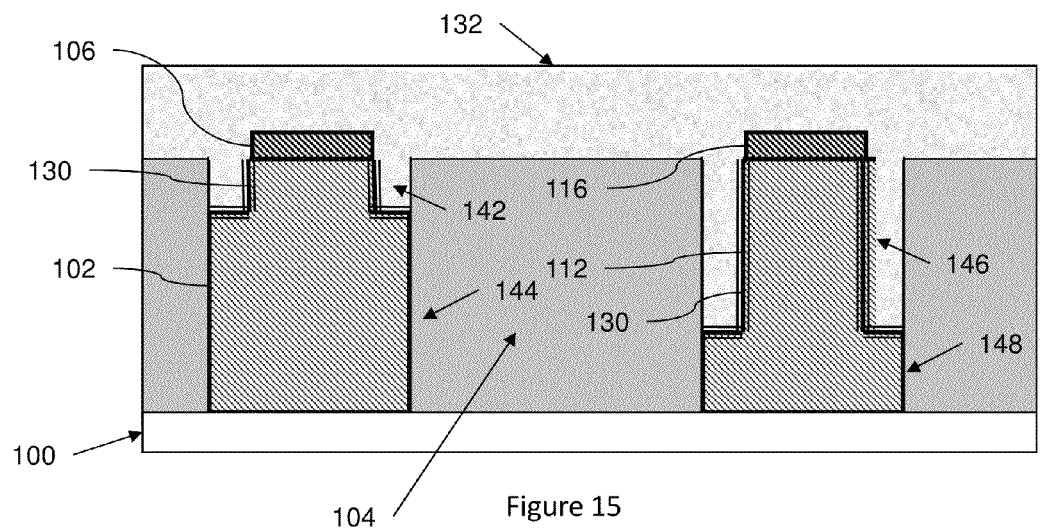
FIG. 15 is a cross-sectional side view of a partially completed transistor structure.
Figure 16:
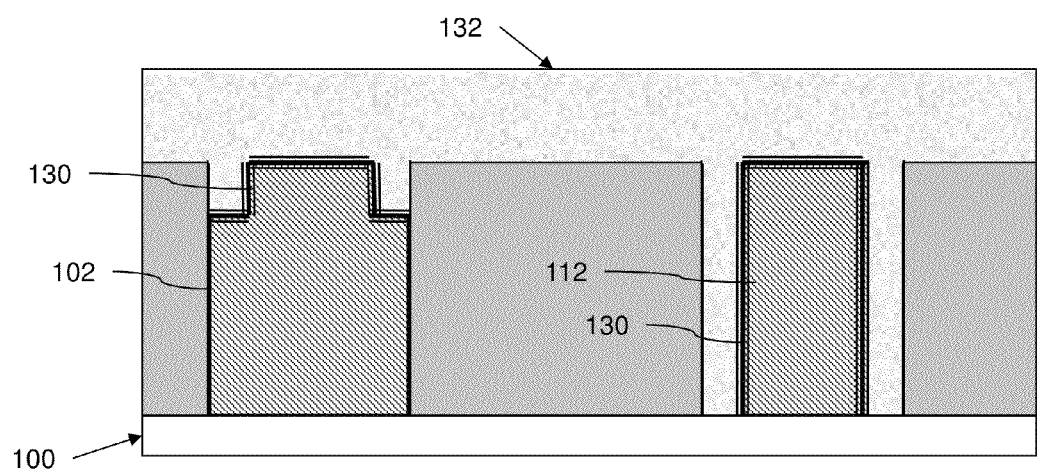
FIG. 16 is a cross-sectional side view of a partially completed transistor structure.
Figure 17:
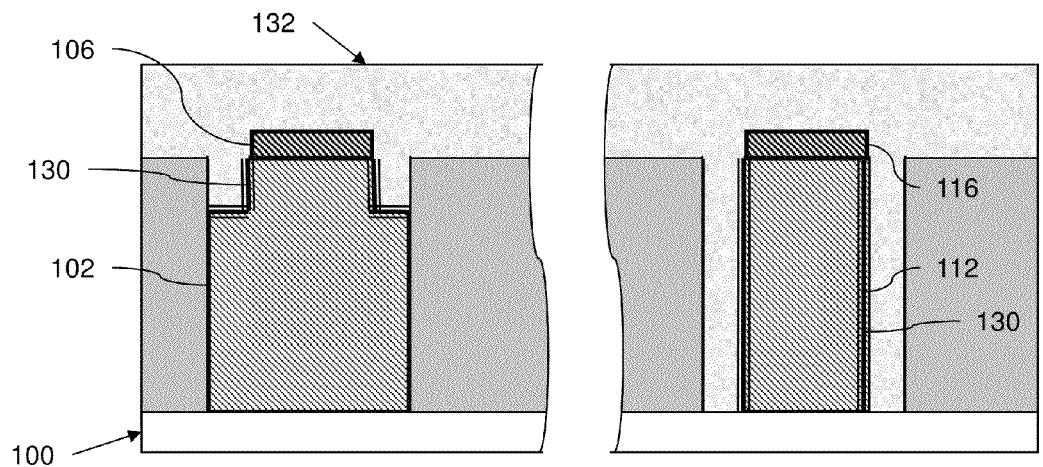
FIG. 17 is a cross-sectional side view of a partially completed transistor structure.
Figure 18:
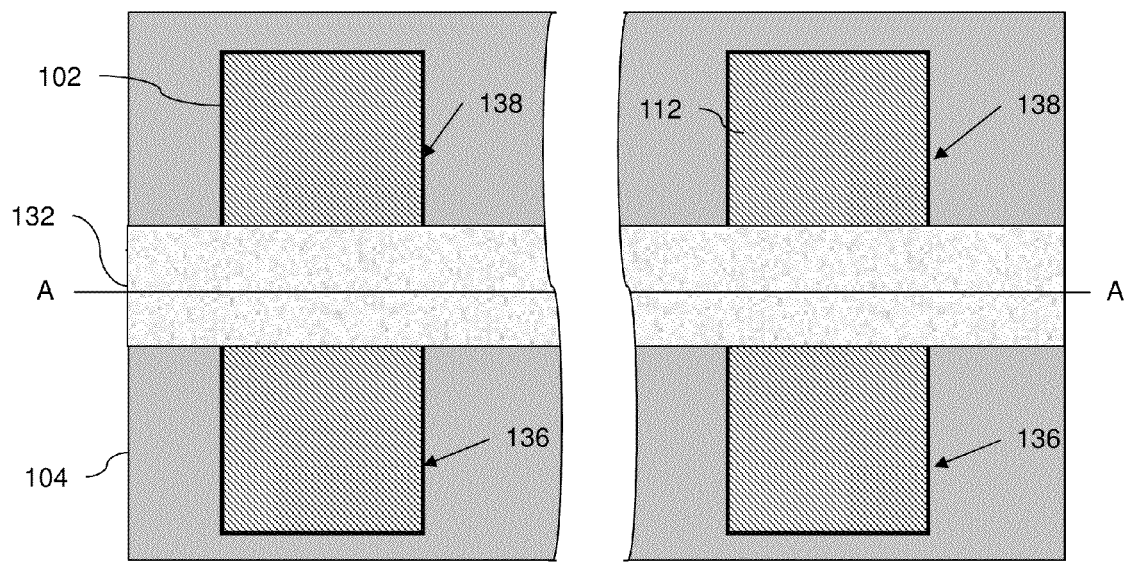
FIG. 18 is a top view of a partially completed transistor structure.

The first and second silicon regions 102, 112 can be used to form a multiple gate field effect transistor (MUGFET) as shown in FIGS. 14 and 15, or a tri-gate or fin-type field effect transistor (FINFET) by removing the first hardmask 106, as shown in FIG. 16. Further, the first and second silicon regions can be adjacent one another and form parts of a single transistor device (FIGS. 1-16) or can be separated from one another on the substrate, and form parts of different transistor devices on the substrate (FIGS. 17-18).

Referring again to FIGS. 13-15, one exemplary structure embodiment herein is a field effect transistor structure that includes a first rectangular fin structure 102 positioned on the substrate. The first rectangular fin structure 102 has a bottom contacting the substrate 100, a top opposite the bottom, and sides between the top and the bottom. Also included is a second rectangular fin structure 112 positioned on the substrate. Similarly, the second rectangular fin structure 112 has a bottom contacting the substrate, a top opposite the bottom, and sides between the top and the bottom. The sides of the second rectangular fin structure 112 are parallel to the sides of the first rectangular fin structure 102.

This structure also includes a trench insulator 104 positioned on the substrate 100 and positioned between a (contacting) side of the first rectangular fin structure 102 and a side of the second rectangular fin structure 112. A gate conductor 132 is positioned on the trench insulator 104, positioned over the sides and the top of the first rectangular fin structure 102, and positioned over the sides and the top of the second rectangular fin structure 112. The gate conductor 132 is a conformal rectangular structure that runs perpendicular to the sides of the first rectangular fin structure 102 and the sides of the second rectangular fin structure 112. A gate insulator 130 is positioned between the (contacting) gate conductor 132 and the first rectangular fin structure 102 and between the gate (contacting) conductor 132 and the second rectangular fin structure 112.

The sides of the first rectangular fin structure 102 comprise a lower portion 144 and an upper portion 142. To the contrary, in the example shown in FIG. 13, the sides of the second rectangular fin structure 112 are linear from the top (from the first hardmask 116) to the bottom (to the buried oxide 100).

The upper portion 142 of the sides of the first rectangular fin structure 102 are relatively closer to the center of the first rectangular fin structure 102 and the lower portion 144 of the sides of the first rectangular fin structure 102 are relatively farther from the center of the first rectangular fin structure 102. The gate insulator 130 and gate conductor 132 are positioned adjacent to the upper portion 142 of the sides of the first rectangular fin structure 102 and are not positioned adjacent to the lower portion 144 of the sides of the first rectangular fin structure 102. The lower portion 144 of the sides of the first rectangular fin structure 102 are positioned adjacent to the trench insulator 104. Thus, the gate insulator 130 and gate conductor 132 are positioned adjacent to a relatively larger portion of the sides of the second rectangular fin structure 112 and are positioned adjacent to a relatively smaller portion of the sides of the first rectangular fin structure 102.

Similarly in the embodiment shown in FIG. 15, the sides of the second rectangular fin structure 112 also comprise a lower portion 146 and an upper portion 148. The upper portion 146 of the sides of the second rectangular fin structure 112 are relatively closer to the center of the second rectangular fin structure 112 and the lower portion 148 of the sides of the second rectangular fin structure 102 are relatively farther from the center of the second rectangular fin structure 112. The gate insulator 130 and gate conductor 132 are positioned adjacent to the upper portion 146 of the sides of the second rectangular fin structure 112 and are not positioned adjacent to the lower portion 148 of the sides of the second rectangular fin structure 112. The lower portion 146 of the sides of the second rectangular fin structure 112 are positioned adjacent to the trench insulator 104. However, despite this, the gate insulator 130 and gate conductor 132 are positioned adjacent to a relatively larger portion of the sides 146 of the second rectangular fin structure 112 and are positioned adjacent to a relatively smaller portion of the sides 142 of the first rectangular fin structure 102 because the upper portion 142 of the first rectangular fin structure 102 are smaller than the upper portion 146 of the second rectangular fin structure 112.

As mentioned above, the first and second rectangular fin structures can be used in a multiple gate field effect transistor (MUGFET), or tri-gate or fin-type field effect transistors (FINFET). In the MUGFET, a first cap 106 can be on the top of the first rectangular fin structure 102 and a second cap 116 can be on the top of the second rectangular fin structure 112 (FIGS. 13 and 15). The caps 106, 116 separate the gate insulator 130 and the gate conductor 132 from the first and second rectangular fin structures 102, 112. Alternatively, in the FINFET, there may be no caps (FIG. 16) and the gate insulator 130 separates the gate conductor 132 from the sides and top of first and second rectangular fin structures 102, 112.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the invention because, as would be understood by those ordinarily skilled in the art, the invention is applicable to structures that include many of each type of transistor shown in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A field effect transistor structure comprising:
a substrate;
a first rectangular fin structure positioned on said substrate, said first rectangular fin structure having a bottom contacting said substrate, a top opposite said bottom, and sides between said top and said bottom;
a second rectangular fin structure positioned on said substrate, said second rectangular fin structure having a bottom contacting said substrate, a top opposite said bottom, and sides between said top and said bottom, said sides of said second rectangular fin structure being parallel to said sides of said first rectangular fin structure;
a trench insulator positioned on said substrate and positioned between a side of said first rectangular fin structure and a side of said second rectangular fin structure;
a gate conductor positioned on said trench insulator, positioned over said sides and said top of said first rectangular fin structure and positioned over said sides and said top of said second rectangular fin structure, said gate conductor running perpendicular to said sides of said first rectangular fin structure and said sides of said second rectangular fin structure; and
a gate insulator positioned between said gate conductor and said first rectangular fin structure and between said gate conductor and said second rectangular fin structure,
said sides of said first rectangular fin structure comprising a lower portion and an upper portion,
said upper portion of said sides of said first rectangular fin structure being relatively closer to said top of said first rectangular fin structure and said lower portion of said sides of said first rectangular fin structure being relatively farther from said top of said first rectangular fin structure,
said gate conductor being positioned adjacent to said upper portion of said sides of said first rectangular fin structure,
said lower portion of said sides of said first rectangular fin structure being positioned adjacent to said trench insulator,
said gate conductor being positioned adjacent to a relatively larger portion of said sides of said second rectangular fin structure and being positioned adjacent to a relatively smaller portion of said sides of said first rectangular fin structure,
said first rectangular fin structure comprising a central semiconductor portion comprising a channel region, and comprising conductive end portions comprising source and drain regions, and
said second rectangular fin structure comprising a central semiconductor portion comprising a channel region, and comprising conductive end portions comprising source and drain regions.

2. The field effect transistor structure according to claim 1, further comprising:
a first cap on said top of said first rectangular fin structure, said first cap separating said gate conductor from said first rectangular fin structure; and
a second cap on said top of said second rectangular fin structure, said second cap separating said gate conductor from said first rectangular fin structure.

3. The field effect transistor structure according to claim 1, said gate insulator separating said gate conductor from said sides and top of first rectangular fin structure, and said gate insulator separating said gate conductor from said sides and top of second rectangular fin structure.

4. The field effect transistor structure according to claim 1, said first rectangular fin structure and said second rectangular fin structure being one of:
adjacent one another and forming parts of a single transistor device; and
separated from one another on said substrate, and forming parts of different transistor devices on said substrate.

5. The field effect transistor structure according to claim 1, said first rectangular fin structure and said second rectangular fin structure comprising one of a multiple gate field effect transistor (MUGFET) and a fin-type field effect transistor (FINFET).

6. A field effect transistor structure comprising:
a substrate;
a first rectangular fin structure positioned on said substrate, said first rectangular fin structure having a bottom contacting said substrate, a top opposite said bottom, and sides between said top and said bottom;
a second rectangular fin structure positioned on said substrate, said second rectangular fin structure having a bottom contacting said substrate, a top opposite said bottom, and sides between said top and said bottom, said sides of said second rectangular fin structure being parallel to said sides of said first rectangular fin structure;
a trench insulator positioned on said substrate and positioned between a side of said first rectangular fin structure and a side of said second rectangular fin structure;
a gate conductor positioned on said trench insulator, positioned over said sides and said top of said first rectangular fin structure and positioned over said sides and said top of said second rectangular fin structure, said gate conductor running perpendicular to said sides of said first rectangular fin structure and said sides of said second rectangular fin structure; and
a gate insulator positioned between said gate conductor and said first rectangular fin structure and between said gate conductor and said second rectangular fin structure,
said sides of said first rectangular fin structure comprising a lower portion and an upper portion,
said upper portion of said sides of said first rectangular fin structure being relatively closer to said top of said first rectangular fin structure and said lower portion of said sides of said first rectangular fin structure being relatively farther from said top of said first rectangular fin structure,
said gate conductor being positioned adjacent to said upper portion of said sides of said first rectangular fin structure,
said lower portion of said sides of said first rectangular fin structure being positioned adjacent to said trench insulator,
said gate conductor being positioned adjacent to a relatively larger portion of said sides of said second rectangular fin structure and being positioned adjacent to a relatively smaller portion of said sides of said first rectangular fin structure,
said first rectangular fin structure comprising a central semiconductor portion comprising a channel region, and comprising conductive end portions comprising source and drain regions, said second rectangular fin structure comprising a central semiconductor portion comprising a channel region, and comprising conductive end portions comprising source and drain regions, and said first rectangular fin structure and said second rectangular fin structure being adjacent one another and forming parts of a single transistor device.

7. The field effect transistor structure according to claim 6, further comprising:

a first cap on said top of said first rectangular fin structure, said first cap separating said gate conductor from said first rectangular fin structure; and a second cap on said top of said second rectangular fin structure, said second cap separating said gate conductor from said first rectangular fin structure.

8. The field effect transistor structure according to claim 6, said gate insulator separating said gate conductor from said sides and top of first rectangular fin structure, and said gate insulator separating said gate conductor from said sides and top of second rectangular fin structure.

9. The field effect transistor structure according to claim 6, said first rectangular fin structure and said second rectangular fin structure comprising one of a multiple gate field effect transistor (MUGFET) and a fin-type field effect transistor (FINFET).

* * * * *